United States Patent
Heightley et al.

(10) Patent No.: US 6,434,069 B1
(45) Date of Patent: Aug. 13, 2002

(54) TWO-PHASE CHARGE-SHARING DATA LATCH FOR MEMORY CIRCUIT

(75) Inventors: John D. Heightley; Kim Carver Hardee, both of Colorado Springs, CO (US)

(73) Assignees: United Memories, Inc., Colorado Springs, IL (US); Sony Corporation, Tokyo (JP)

( * ) Notice: Subject to any disclaimer, the term of this patent is extended or adjusted under 35 U.S.C. 154(b) by 0 days.

(21) Appl. No.: 09/595,099

(22) Filed: Jun. 16, 2000

Related U.S. Application Data

(60) Provisional application No. 60/185,300, filed on Feb. 28, 2000.

(51) Int. Cl.[7] .................................................. G11C 7/00
(52) U.S. Cl. ..................................... 365/203; 365/189.05
(58) Field of Search ............................ 365/203, 189.05, 365/189.01, 207, 208

(56) References Cited

U.S. PATENT DOCUMENTS

| | | | | |
|---|---|---|---|---|
| 5,023,841 A | * | 6/1991 | Akrout | 365/205 |
| 5,796,665 A | * | 8/1998 | Ternull | 385/203 |
| 6,188,624 B1 | * | 2/2001 | Zheng | 365/207 |

* cited by examiner

*Primary Examiner*—A. Zarabian
(74) *Attorney, Agent, or Firm*—Cook, Alex, McFarron, Manzo, Cummings & Mehler, Ltd.

(57) ABSTRACT

A read data latch circuit that requires only two phases to execute a data read cycle. The date read lines and data latch lines are precharged and equalized during the data read cycle. A separate phase for equalizing the data latch nodes is eliminated. Rather, the data latch nodes charge share with the previously equalized and precharged data lines. The latch nodes are effectively precharged and equalized, as the capacitance on the data lines is much larger than the capacitance on the data latch nodes.

4 Claims, 4 Drawing Sheets

TWO-PHASE CHARGE-SHARING DATA LATCH FOR MEMORY CIRCUIT

RELATED APPLICATION

This application claims priority to U.S. Provisional Application No. 60/185,300, filed Feb. 28, 2000, related U.S. Ser. No. 09/595,143, filed Jun. 16, 2000, now U.S. Pat. No. 6,339,541 and related U.S. application Ser. No. 09/547,384, filed Apr. 11, 2000. The entire disclosures of U.S. Ser. No. 60/185,300, U.S. Ser. No. 09/547,384, and U.S. Ser. No. 09/595,143 are hereby incorporated herein by reference.

BACKGROUND OF THE INVENTION

A semiconductor memory unit is a collection of storage cells together with associated circuits needed to transfer information (data) in and out of the device. Two basic types of semiconductor memories are nonvolatile, of which a ROM (read-only memory) is typical, and volatile, of which a RAM (random access memory) is typical.

In ROM, data is permanently or semi-permanently stored and can be read at any time. In a ROM in which the data are permanently stored, data is either manufactured into the device or programmed into the device and cannot be altered. In a ROM in which the data are semi-permanently stored, the data can be altered by special methods, such as by exposure to ultraviolet light or by electrical means. ROM write operations require special methods.

RAM is memory that has both read and write capabilities. RAM circuits generally come in two forms. The first form of RAM is known as a static RAM circuit ("SRAM"). A primary characteristic of an SRAM circuit is that the circuit has latches in which data may be indefinitely retained, provided power is connected to the circuit. The second form of RAM is known as a dynamic RAM circuit ("DRAM"). A primary characteristic of a DRAM circuit is that the circuit uses charge storing elements, such as capacitors, to retain the stored data in the storage locations, and the circuit must periodically refresh its data to retain it.

A conventional computer or processor has internal (or main) RAM. The computer can manipulate data only when it is in the main memory. Every program executed and file accessed must be copied from a storage device into main memory. After program or file data manipulation or utilization is complete, the RAM bits that comprise that data may be erased or overwritten by another program or file. Thus, the amount of main memory on a computer is important, as it determines how many programs can be executed at one time and how much data can be readily available to a program.

One restraint on computer memory (ROM or RAM) capacity is the physical dimensions of a disk or chip. RAM capacity is limited also by power, heat, and manufacturing limitation constraints. Because a single chip may store millions of bits of data, simplification of chip circuitry for processing bits in and out of ROM and RAM is highly desired.

The communication between a memory and its environment is achieved through data input and/or output lines, address selection lines, and control lines that specify the direction of transfer. In a conventional memory circuit, data is stored in a plurality of storage locations arranged as an array (or a group of sub-arrays) of memory cells. Each storage location is identified by an address, which might include both a row identifier and a column identifier. In conventional memory circuits, internal data lines transfer the data to the storage locations during a write cycle and transfer the data from the storage locations during a read cycle.

A simplified overview of a prior art read cycle will now be described. Three generalized components of a prior art read cycle are represented in FIG. 1. Memory cell 10 is one of the thousands or millions of storage locations within a memory 12. While each storage location may accommodate one or more bits, to simplify the present discussion, it will be assumed that memory cell 10 has only one bit. For purposes of this discussion, it may be assumed that the proper addressing and control signals have been activated for accessing the contents of memory cell 10.

As is well known by those skilled in the art, bit data processing must occur within predetermined timing specifications. The rate of bit processing not only affects the overall speed of the processor, but bits sequentially occupy the same processing components and lines. Thus, it is desirable to have fast bit data processing speeds. Typically, however, the magnitude of the charge stored for representing a bit in memory storage is too low to quickly drive output circuits. Consequently, circuitry has been incorporated into memory chips to increase the speed of data read cycles. To ameliorate the aforementioned processing speed and power constraints, read processing circuitry 14 has been incorporated in memory chips for processing bit data to external circuitry 18. Generally, such circuitry has been devised for quickly detecting the status of the bit, i.e., "0" or "1", and for responsively providing a bit status data signal that can quickly and accurately be detected by the external circuitry.

Prior art read processing circuitry 14 has included transposing the bit data as represented in the memory cell bank to a format that is more suitable for processing. One such format represents bit data (0 or 1) on dual data lines, A and B, as follows:

| BIT | "A" line | "B" line |
|---|---|---|
| 0 | HIGH | LOW |
| 1 | LOW | HIGH |

In this example, the signals on lines A and B are processed in parallel from a data line to a latch. The latch receives the signals on lines A and B at latch inputs and responsively provides output signals on output lines A and B. The signals on the output lines are preferably driven HIGH by the system power source and driven LOW by system ground, thus providing relatively strong output signals to the external circuitry.

In the dual data line embodiment discussed above, it has long been known in the art that there are advantages to "equalizing" the data lines and latch nodes using data line equalization circuitry and latch node equalization circuitry. Equalization ensures that data lines begin at the same potential, thereby preconditioning the lines for the application of opposite (e.g., high or low) bit representation voltages. Thus, received data bit signals will be detected quickly and accurately. It has been recognized in the prior art that these and other advantages are realized by equalizing the data latch input nodes, which receive on the "A" line and the "B" line high and low data bit signals and responsively provide HIGH and LOW output signals.

In the prior art, the data latch nodes and the data lines are equilibrated by pre-charging both the latch nodes and the data lines to the same voltage magnitude. Typically, the latch nodes and data lines are both temporarily connected to a voltage source, such as the chip power supply. In this example, the data lines and latch nodes are both charged to VCC and then isolated from the chip power supply. The equilibrated data lines ("A" and "B") receive the bit data signals, which are thereafter (in accord with processor timing specifications) provided to the equilibrated data latch nodes. Such a pre-charge and latching process may be characterized as a 3-phase latch, as discussed below.

An example of a 3-phase read data latch system 20 is shown in FIG. 2. The read data latch system 20 shown functions under the control of control lines 24, 54, 64, and 66. Transistors 26, 28, and 34 function as switches for controlling the pre-charge and equalization of data bit input lines 22A and 22B. These switch transistors operate under the control of data line control line 24.

(Phase I) Initially, data line control line 24 is HIGH, control line 66 is also HIGH and control line 54 is LOW. Meanwhile, control line 64 remains LOW. In this state, data lines 22A and 22B are isolated from one another and from the data latch power source 60. Data line 22A and latch node 62A are in direct electrical communication via switch 56, and data line 22B and latch node 62B are in direct electrical communication via switch 58. Data latch nodes 62A and 62B are isolated from one another. Thus, in this state, the data bit signals provided on lines 22A and 22B will establish a differential signal on the nodes in latch 42.

(Phase II) Next, control line 64 is set HIGH so that latch nodes 62A and 62B may be driven by ground and latch power source 60, in accord with the differential data bit signals received from data lines 22A and 22B. At the same time, control line 54 is set HIGH, to isolate the data lines from the latch nodes, and control line 24 is set LOW. In this state, the data lines 22A and 22B are pre-charged by power source 60 and equalized through switch 30, and the latch 20 outputs a data bit signal on latch nodes 62A and 62B, the data bit signals being driven by the power source 60 and ground.

(Phase III) Next, control line 66 is set LOW and control line 64 is set LOW. In this state, the data latch nodes 62A and 62B are equalized to the HIGH voltage level in preparation for receiving a new differential signal when returning to Phase I.

In the above-described latch, each phase requires an execution time so that the switches may be set as indicated above and the nodes and lines may be driven to their respective voltage levels. The total time for a data read cycle is dependent upon and limited by the number of phases required by the latch design. A 3-phase latch, thus, inherently limits the clock speed of a data read cycle. Therefore, it is desired to overcome the clock speed limitations of a 3-phase data read latch.

SUMMARY OF THE INVENTION

The present invention relates to read path circuitry for memory integrated circuits and particularly to read data latch circuitry optimized for use in high speed memory integrated circuits.

The present invention can be used with any circuit that uses a latch to capture data on an internal bus. The invention allows the use of only two clock edges to perform the entire latch and precharge cycle. The present invention captures the small differential voltage on the internal bus and amplifies it. The result is a reduced cycle time, which provides for higher speed operation.

In the data read circuit disclosed herein, data latch nodes are equilibrated, but not through a direct connection to a power source. Rather, each latch node is equilibrated by sharing the charge of its respective pre-charged data line. Specifically, the data lines, while isolated from the latch nodes, are equilibrated to VCC. Prior to the application of bit data on the data lines, a switch is activated so that each latch node is electrically connected to its respective data line. The capacitance of each latch node, which is much smaller relative to its respective data line capacitance, provides a charge sharing scheme through which the latch nodes are equilibrated to VCC.

BRIEF DESCRIPTION OF THE DRAWINGS

In describing the present invention (and prior art), reference is made to accompanying drawings wherein.

DETAILED DESCRIPTION OF THE PREFERRED EMBODIMENT

In the present invention, a data latch is connected to data lines through pass transistors. Instead of equalizing the data latch nodes prior to turning the pass transistors ON, the explicit data latch equalization phase is eliminated and the data latch nodes charge-share with the data lines. In effect, this equalizes the latch nodes because the data lines were previously equalized and precharged, and the capacitance on the data lines is much larger than the capacitance on the data latch nodes. Thus, a separate read-cycle phase for switching the control lines to isolate the latch nodes and allowing the latch nodes to equalize is eliminated.

Figure 1:
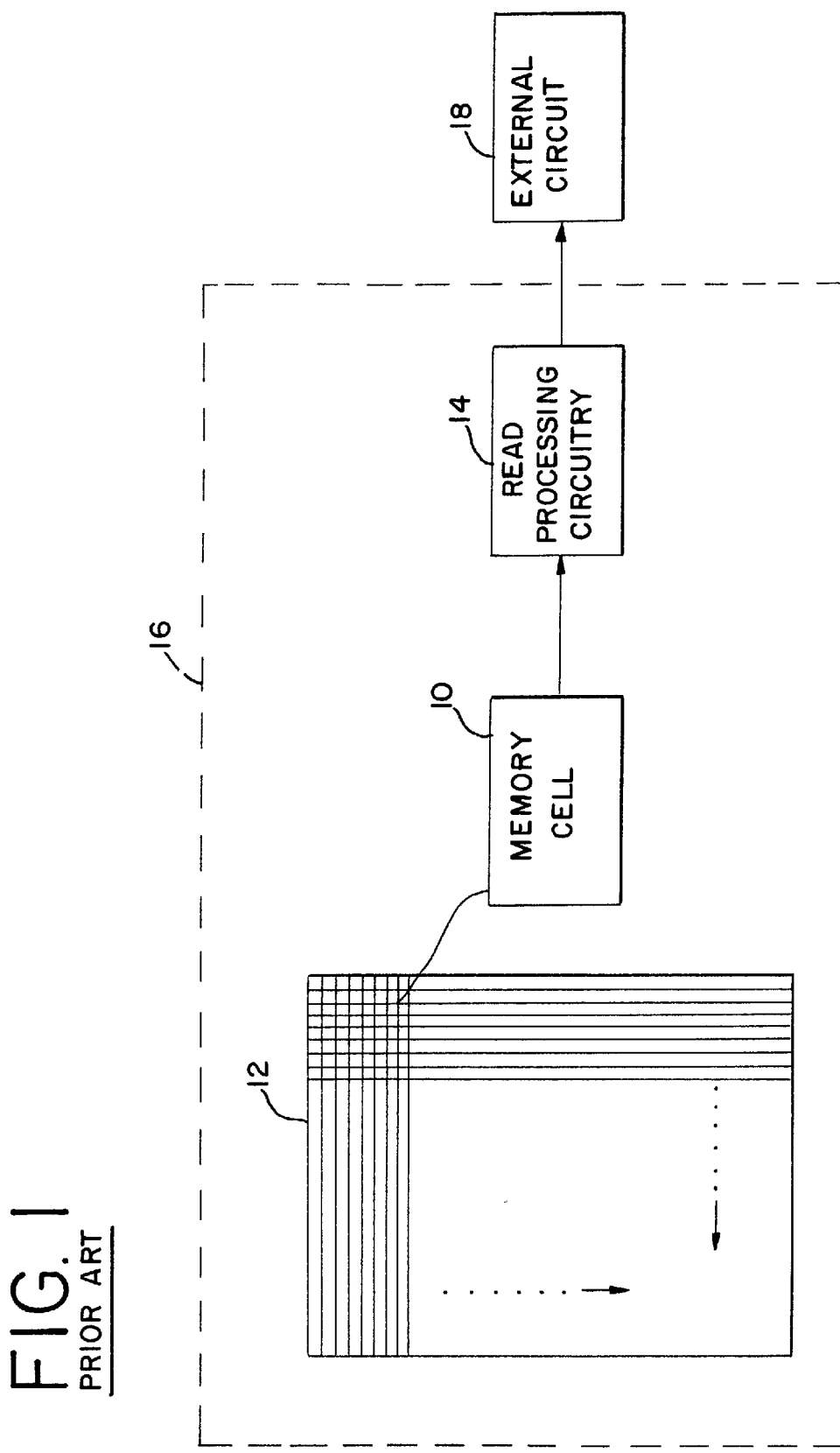
FIG. 1 is a block diagram representation of the fundamental components of a prior art read cycle.
Figure 2:
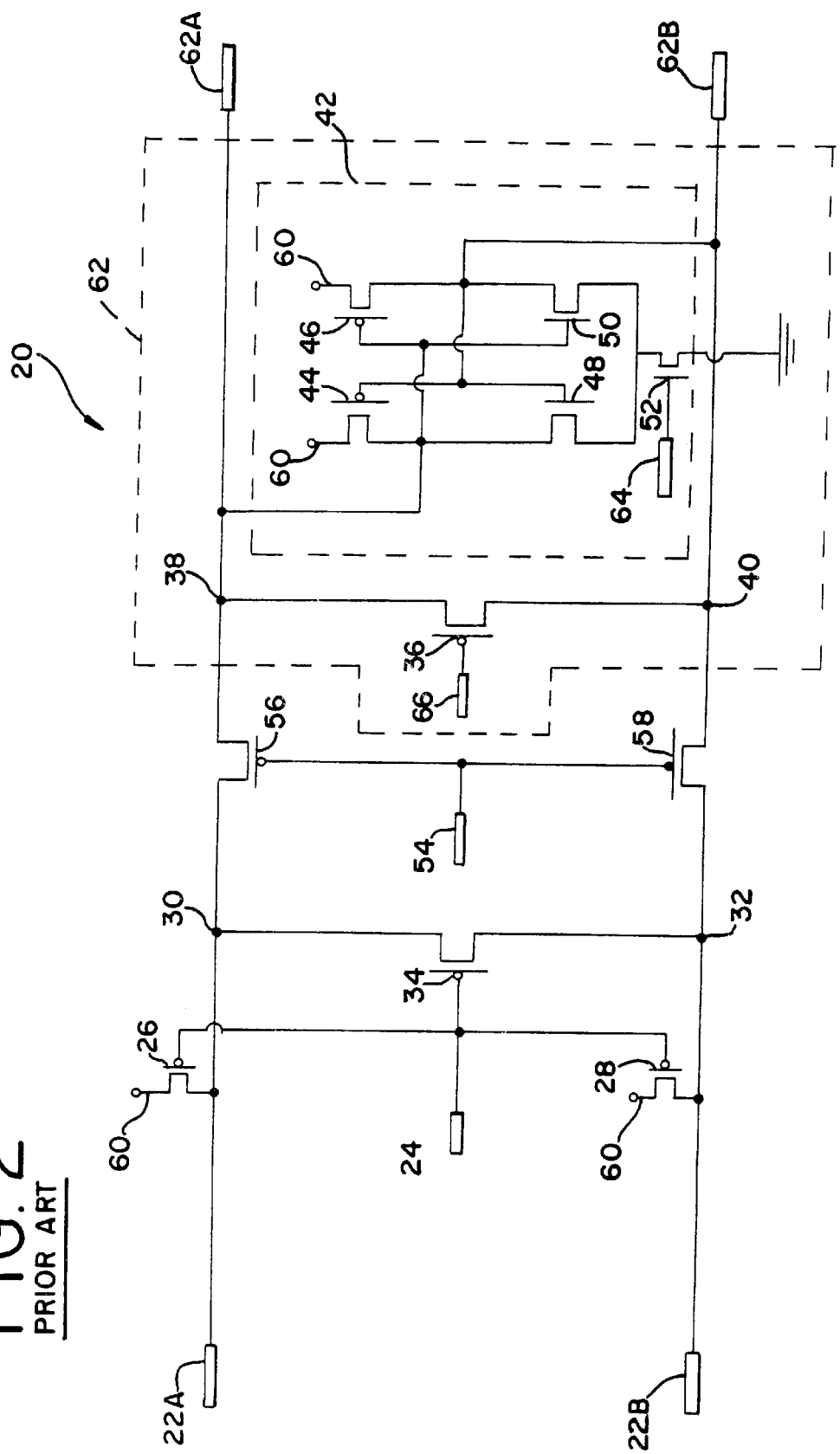
FIG. 2 is a schematic diagram of a 3-phase data read latch circuit.
Figure 3:
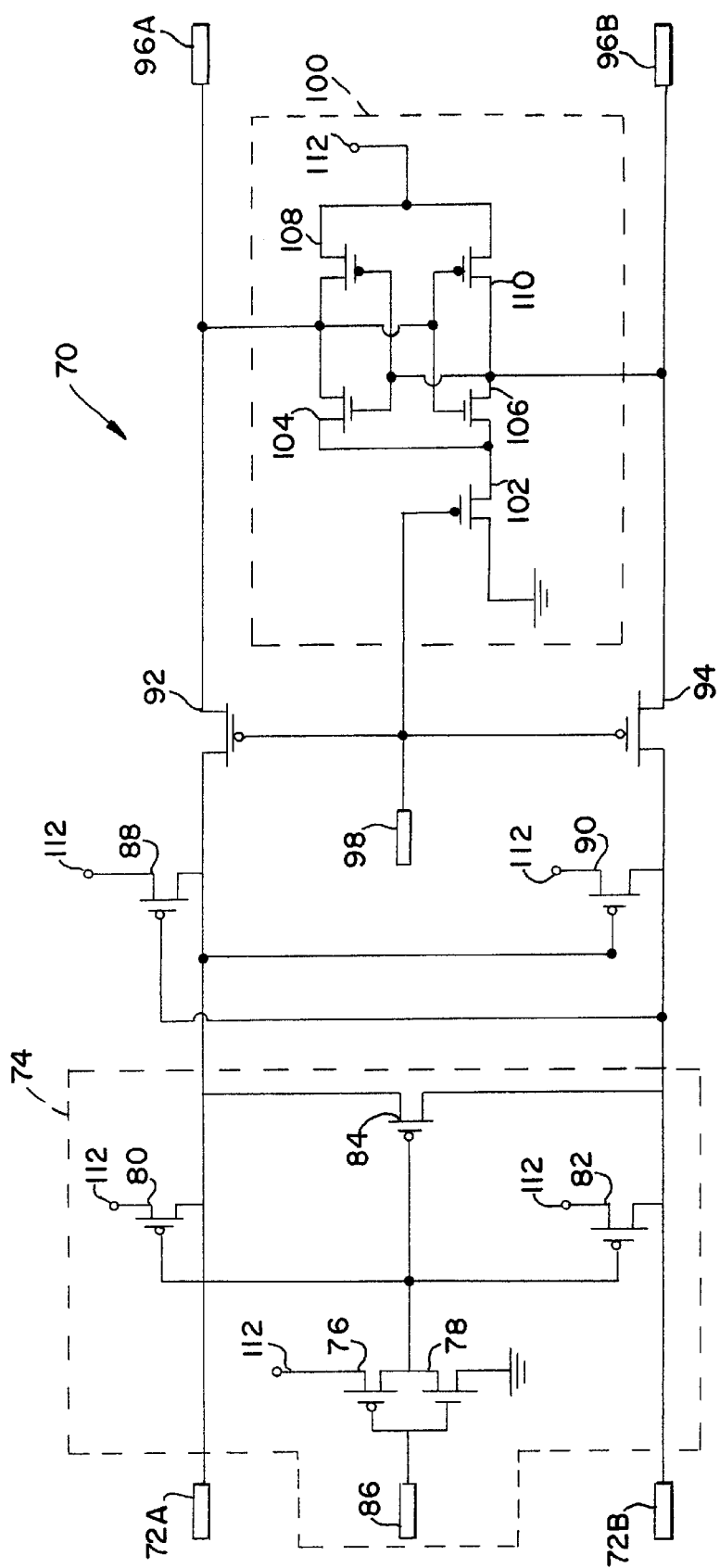
FIG. 3 is a schematic diagram of one embodiment of a 2-phase data read latch of the present invention.

FIG. 3 illustrates the preferred electronic components included within a 2-phase data read latch 70. This circuit and a related circuit are shown and described in U.S. Provisional Application No. 601/185,300, filed Feb. 28, 2000, naming Kim Carver Hardee and John D. Heightley as inventors, the disclosure of which is hereby incorporated herein by reference.

Data read latch 70 is designed to amplify the differential voltage between global read data line 72A and global read data line 72B during a read operation and to latch the signal for subsequent processing by external circuits. It will be appreciated that data read latch 70 might be external to the memory circuit, though this is not necessarily the case. In FIG. 3, connections to a voltage or power source are indicated by reference numeral 112.

Data read latch 70 includes a pre-charge circuit 74 preferably having four driver transistors 76, 78, 80, and 82 and an equalizing transistor 84. Pre-charge circuit 74 is controlled by precharge control line 86. As will be appreciated, pre-charge circuit 74 functions to pull global data line 72A and global data line 72B HIGH and equalizes them prior to a read operation. During a read operation, precharge control line 86 toggles LOW, thereby disabling precharge circuit 74. Data read latch 70 further includes driver transistors 88 and 90 that function to hold one of the global read data lines 72A, 72B HIGH, while the other global read data line 72A, 72B is driven LOW. Driver transistors 88 and 90 are shown illustratively as PMOS devices.

In addition to the foregoing, data read latch 70 includes a pair of pass transistors 92 and 94 which are shown illustratively as PMOS devices. Pass transistor 92 is connected in series between global data line 72A and latched read data line 96A. Pass transistor 94 is connected in series between global read data line 72B and latched read data line 96B. Pass transistors 92 and 94 are controlled by latch control line 98 and are conductive during the initial phase of the read cycle to pass the amplified small differential voltage signal between global data lines 72A and 72B to the latched read data lines 96A and 96B.

Data read latch 70 further includes a latch circuit 100 having N-channel transistors 102, 104, and 106 and P-channel transistors 108 and 110. Latch circuit 100 is controlled by latch control line 98. When latch control line 98 enables latch circuit 100, the small differential voltage between latched read data line 72A and latched read data line 72B is amplified and latched with one line held at Vcc potential and the other line held at Vss (ground) potential, as determined by the initial differential voltage.

Figure 4:
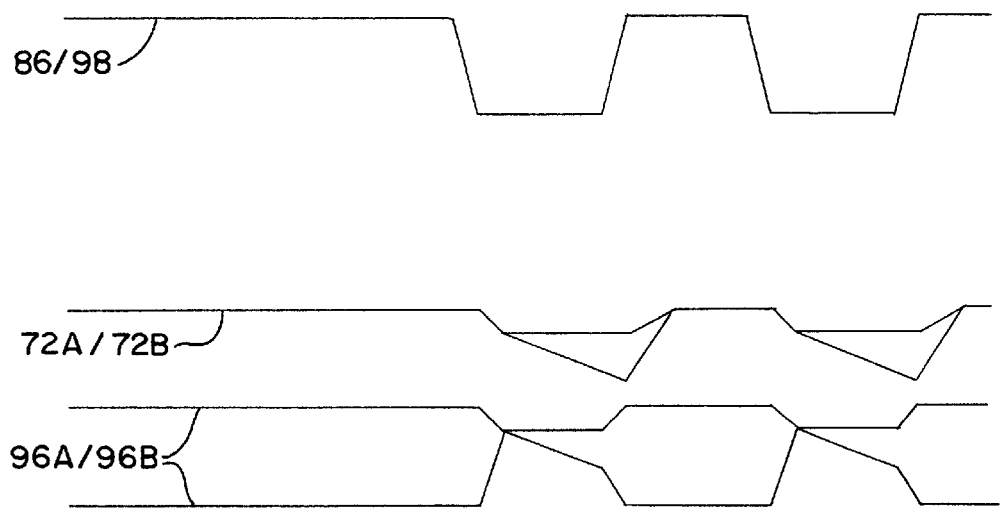
FIG. 4 is a timing diagram showing the preferred timing scheme for certain signals on particular lines of the read latch circuitry shown in FIG. 3.

Referring to FIG. 4, the timing scheme for signals on certain lines depicted in FIG. 3 is shown. While a read operation is not occurring, the data line control signal 86 and the latch control line signal 98 are HIGH, the signals on global data read lines 72A and 72B are pre-charged to Vcc potential, and the signals on the latch nodes 96A, 96B are held at their previous states.

Upon the occurrence of a read operation, the data line control signal 86 and the latch control line signal 98 go LOW, and the latch nodes equilibrate to the previous pre-charge level of the data read lines. Simultaneously, a differential voltage indicative of the data bit signal is applied to global data lines 72A and 72B and the latch nodes. When the data line control signal 86 and the latch control line signal 98 return HIGH the data read latch amplifies the differential voltage present across the global data lines 72A and 72B and latches that signal across the latch nodes 96A and 96B.

By keeping the capacitances on the data latch nodes 96A and 96B small compared to the capacitance on the data read lines 72A and 72B, then the previously required third phase of the clock could be eliminated and a two phase data latch circuit that has charge sharing can be designed. The previous third phase had equalized the data latch nodes prior to shorting them to the data read lines. In the preferred embodiment of the present invention, the data read lines constitute global data read lines.

The result of this invention is a small voltage offset on the data read lines due to opposite previous data on the latch nodes 96A and 96B. As long as the voltage offset is small compared to the total differential voltage that is developed during a read operation on the data read lines 72A and 72B, then the two phase scheme is viable. In effect, some of the signal margin is given up to eliminate a clock phase and thereby increase memory circuit speed. For a 500 MHz circuit, the clock pulse widths can be one nanosecond each.

Details of the preferred embodiment for a sense amp latch, column select and column decoder circuits, and local data line select and data line decoder circuits are well known in the art. The read latch described herein can be used in the memory circuit shown and described in U.S. Ser. No. 09/595,143, filed Jun. 16, 2000.

It is to be understood that the above-described embodiments are merely illustrative of the principle of the invention and that many variations may be devised by those skilled in the art without departing for the scope of the invention. For example, PMOS or NMOS or other transistor types may be substituted for those shown. It is, therefore, intended that such and other variations be included within the scope of the claims.

What is claimed is:

1. In a data memory circuit, a method for amplifying and latching a signal indicative of data comprising:
   providing a first data latch node having a first capacitance;
   providing a second data latch node having a second capacitance;
   providing a first data line, having a greater capacitance than said first capacitance, for selective connection to the first latch node;
   providing a second data line, having a greater capacitance than said second capacitance, for selective connection to the second latch node;
   in a first phase, isolating the first and second data lines from the respective latch nodes and pre-charging and equalizing said first and second data lines; and
   in a second phase, connecting said first and second latch nodes to said first and second data lines, respectively, permitting a differential voltage signal to be established between said first and second data lines, passing said differential voltage signal to said first and second latch nodes such that said differential voltage signal is present between said first and second latch notes; and
   repeating said steps of said first phase while simultaneously latching and amplifying said differential voltage signal present between said first and second latch nodes.

2. A two-phase charge sharing data latch for a dynamic data amplifier, comprising:
   first and second data latch nodes;
   first and second data lines;
   a first switch for selectively connecting said first data line to said first data latch node;
   a second switch for selectively connecting said second data line to said second data latch node;
   wherein the capacitance of each data line is greater than the capacitance of its respective data latch node and said first and second switches are controllably activated for equalizing said first and second data latch nodes; and
   wherein the amplifier operates in the following manner:
      in a first phase, isolating the first and second data lines from the respective latch nodes and pre-charging and equalizing said first and second data lines; and
      in a second phase, connecting said first and second latch nodes to said first and second data lines, respectively, permitting a differential voltage signal to be established between said first and second data lines, passing said differential voltage signal to said first and second latch nodes such that said differential voltage signal is present between said first and second latch notes; and
      repeating said first phase while simultaneously latching and amplifying said differential voltage signal present between said first and second latch nodes.

3. The two-phase charge sharing data latch of claim 2, further comprising:
   a pre-charge circuit connected to said first and second data lines and controllable for precharging and equalizing said data lines.

4. The two-phase charge sharing data latch of claim 2, wherein said first and second switches comprise first and second PMOS transistors.

* * * * *